US006254720B1

United States Patent
Shih

(10) Patent No.: US 6,254,720 B1
(45) Date of Patent: Jul. 3, 2001

(54) WAFER-PROCESSING APPARATUS

(75) Inventor: Pen-Chen Shih, Yunlin (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/502,618

(22) Filed: Feb. 11, 2000

(30) Foreign Application Priority Data

Apr. 28, 1999 (TW) .............................. 088106868

(51) Int. Cl.$^7$ ................... B08B 3/00; B08B 7/00
(52) U.S. Cl. ............ 156/345; 134/104.1; 134/902; 216/93; 118/715
(58) Field of Search ................ 156/345; 216/93, 216/3, 58, 59, 61; 118/715; 134/22.11, 22.12, 166 R, 168 R, 168 C, 174, 166 C, 169 C, 104.1, 902

(56) References Cited

U.S. PATENT DOCUMENTS

| | | | | |
|---|---|---|---|---|
| 4,286,541 | * | 9/1981 | Blackwood ........................ | 118/52 |
| 5,221,421 | * | 6/1993 | Leibovitz et al. .................. | 216/48 |
| 5,637,153 | * | 6/1997 | Niino et al. ..................... | 134/22.11 |
| 5,845,660 | * | 12/1998 | Shindo et al. .................... | 134/56 R |
| 6,033,479 | * | 3/2000 | Ikeda ............................. | 118/688 |
| 6,045,624 | * | 4/2000 | Kamikawa et al. ............... | 134/30 |
| 6,082,381 | * | 7/2000 | Kamikawa et al. ............... | 134/57 R |

* cited by examiner

Primary Examiner—Gregory Mills
Assistant Examiner—Sylvia R. MacArthur
(74) Attorney, Agent, or Firm—Dike, Bronstein, Roberts & Cushman; David G. Conlin; Peter F. Corless

(57) ABSTRACT

A wafer-processing apparatus is provided which includes an container, a gas-supplying pipe, a pressure-leveling sensor, a controller, and an auto-cleaning device. The container is used for containing an processing solution. The gas-supplying pipe is used for supplying a gas into the container, wherein a pressure of the gas contained in the gas-supplying pipe is relative to a level of the processing solution. The pressure-leveling sensor connected to the gas-supplying pipe is used for detecting a pressure change of the gas contained in the gas-supplying pipe and correspondingly outputting a level signal. The controller electrically connected to the container and the pressure-leveling sensor is used for outputting a discharge signal to control the container to discharge the processing solution after a predetermined amount of wafers has been etched by the processing solution, and controlling an charge valve to charge the container with the processing solution in response to the level signal. The auto-cleaning device connected to the gas-supplying pipe and electrically connected to the controller and the pressure-leveling sensor is used for stopping the gas being supplied into the container, stopping the pressure-leveling sensor to output the level signal, and cleaning the gas-supplying pipe with a cleaning solution in response to the discharge signal, then, outputting a clean-stop signal to restart the gas being supplied into the container, to restart the pressure-leveling sensor to output the level signal, and to stop the cleaning of the gas-supplying pipe after a predetermined time.

22 Claims, 4 Drawing Sheets

US 6,254,720 B1

WAFER-PROCESSING APPARATUS

FIELD OF THE INVENTION

The present invention relates to a wafer-processing apparatus, and especially to a wafer-processing apparatus having an auto-cleaning device.

BACKGROUND OF THE INVENTION

In the process of fabricating semiconductor devices, each wafer needs to be etched for several times. A wafer-processing apparatus is used for etching wafers therein. Please refer to FIG. 1 schematically showing a conventional wafer-processing apparatus. An etching-solution container 11 is used for containing an etching solution, such as a buffer oxide etcher (BOE) and a buffer hydrofluoric acid solution (BHF). A gas-supplying pipe 14 is used for supplying a gas, such as an inert gas or nitrogen gas ($N_2$), into said etching-solution container 11. Because the pressure of the inert gas contained in the gas-supplying pipe 14 is relative to a level of the etching solution, the level change of the etching solution can be controlled by detecting the pressure change of the inert gas. A pressure-leveling sensor 13 is used for detecting the pressure change of gas contained in the gas-supplying pipe 14 and correspondingly outputting a level signal to a controller 12. There are three kinds of level signals. A FIX level (FL) signal represents that the level of the etching solution is at a suitable level, a LOW level (LL) signal represents that the level of the etching solution is lower than the suitable level, and a HIGH level (HL) signal represents that the level of the etching solution is higher than the suitable level. Therefore, the controller 12 can control the level of the etching solution contained in he etching-solution container 11 according to the level signal.

The etching solution needs to be renewed after a predetermined amount of wafers has been etched by the etching solution because the etching solution is too dirty to etch more wafers. FIG. 2 is a flowchart showing the etching-solution-renewing process of the conventional wafer-processing apparatus. After the predetermined amount of wafers has been etched by the etching solution, the controller 12 outputs a discharge signal to the discharge valve 15 so as to have the discharge valve 15 discharge the etching solution from the etching solution container 11. Meanwhile, after the level of the etching solution is dropped below the suitable level, the pressure-leveling sensor 13 will output an LL signal to the controller 12. When the controller 12 receives the LL signal, the controller 12 outputs a close signal to close the discharge valve 15 after a short time to ensure that the etching solution is discharged completely. Then, the controller 12 will output a charge signal to the charge valve 16 so as to have the charge valve 16 charge the etching solution into the etching-solution container 11. The charge valve 16 will be closed by the controller 12 until a FL signal is outputted from the pressure-leveling sensor 13.

However, the conventional wafer-processing apparatus has some drawbacks. For the cleaning aspect, the gas supplied from the gas-supplying pipe 14 has been purposely dried in advance to eliminate the damp. Therefore, the dried gas will absorb a lot of damp from the etching solution when the dried gas is supplied into the etching-solution container 11, and the solutes contained in the damp will be dissolved out after water evaporates. These particles will usually adhere to the inner surface of the gas-supplying pipe 14. When the particles adhering onto the wall becomes very thick, the gas-supplying pipe 14 will be choked up and the pressure-leveling sensor 13 will not detect the pressure change of the gas precisely so that the wafer-processing apparatus needs to be stopped to clean the choked gas-supplying pipe 14. The cleaning process of the conventional wafer-processing apparatus is very time-consuming and etching-solution-wasting. In addition, when the cleaning process is done by men, it is very dangerous for the machine keepers to expose to such a harmful environment.

SUMMARY OF THE INVENTION

It is an object of the present invention to provide a novel wafer-processing apparatus such that the aforementioned limitations and difficulties encountered with the prior art can be overcome.

Specifically, it is an object of the present invention to provide a novel wafer-processing apparatus without wasting a lot of etching solution so as to reduce the cleaning cost of the wafer-processing apparatus.

Specifically, it is an object of the present invention to provide a novel wafer-processing apparatus without spending a lot of time to clean the wafer-processing apparatus.

Specifically, it is an object of the present invention to provide a novel wafer-processing apparatus which can be cleaned easily so as to prevent the machine keepers from being exposed to the harmful environment.

It is therefore another object of the present invention to provide a novel wafer-processing apparatus including an auto-cleaning device which can clean the gas-supplying pipe.

It is therefore another further object of the present invention to provide novel wafer-processing apparatus including a cleaning-solution pipe and a cup-shaped joint. The cleaning-solution pipe is used for providing a cleaning solution to clean particles remained on an inner surface of a gas-supplying pipe, and the cup-shaped joint is used for increasing a contact surface area between the gas and the cleaning solution.

A wafer-processing apparatus includes a container, a gas-supplying pipe, a pressure-leveling sensor, a controller, and an auto-cleaning device. The container is used for containing a processing solution. The gas-supplying pipe is used for supplying a gas into the container, wherein a pressure of the gas contained in the gas-supplying pipe is relative to a level of the processing solution. The pressure-leveling sensor connected to the gas-supplying pipe is used for detecting a pressure change of the gas contained in the gas-supplying pipe and correspondingly outputting a level signal. The controller electrically connected to the pressure-leveling sensor is used for outputting a discharge signal to have the container discharge the processing solution after a predetermined amount of wafers has been processed by the processing solution, and controlling a charge valve to charge the container with the processing solution in response to the level signal. The auto-cleaning device connected to the gas-supplying pipe and the pressure-leveling sensor and electrically connected to the controller, stopping the gas being supplied into the container, stopping the pressure-leveling sensor to output the level signal, and cleaning the gas-supplying pipe with a cleaning solution in response to the discharge signal, and then outputting a clean-stop signal to restart the gas being supplied into the container, to restart the pressure-leveling sensor to output the level signal, and to stop the cleaning of the gas-supplying pipe after a predetermined time.

According to the present invention, the container includes a discharge valve for discharging the processing solution therefrom in response to the discharge signal.

According to the present invention, the auto-cleaning device includes a timing controller, a triple valve, a cleaning solution pipe, a clean valve, and a control switch. The timing controller electrically connected to the controller and the pressure-leveling sensor is used for starting to count the predetermined time when the discharge signal is received, and outputting the clean-stop signal after the predetermined time. The triple valve is electrically connected to the controller and the timing controller and having a first end connected to the pressure-leveling sensor, a second end connected to the gas-supplying pipe, and a third end connected to outside, wherein the first end is conducted with the third end in response to the discharge signal and the first end is conducted with the second end in response to the clean-stop signal. The cleaning-solution pipe connected between the second end of the triple valve and the gas-supplying pipe is used for providing the cleaning solution to the gas-supplying pipe to clean particles remained on an inner surface of the gas-supplying pipe. The clean valve set on the cleaning-solution pipe is used for opening the cleaning-solution pipe in response to the discharge signal and closing the cleaning-solution pipe in response to the clean-stop signal. The control switch electrically connected to the controller, the timing controller and the pressure-leveling sensor is used for switching off the pressure-leveling sensor in response to the discharge signal, and switching on the pressure-leveling sensor in response to the clean-stop signal.

Preferably, the control switch is a relay.

Preferably, the processing solution is an etching solution.

Certainly, the processing solution can be a buffer oxide etcher (BOE) or a buffer hydrofluoric acid (BHF) solution.

Preferably, the cleaning solution is water.

Preferably, the gas can be an inert gas, such as argon gas (Ar) or nitrogen gas ($N_2$).

According to the present invention, the gas should have been dried in advance.

The wafer-processing apparatus of the present invention includes a container, a gas-supplying pipe, a pressure-leveling sensor, a controller, a cleaning-solution pipe, and a cup-shaped joint. The container is used for containing a processing solution. The gas-supplying pipe is used for supplying a gas into the container, wherein a pressure of the gas contained in the gas-supplying pipe is relative to a level of the processing solution. The pressure-leveling sensor connected to the gas-supplying pipe is used for detecting a pressure change of the gas contained in the gas-supplying pipe and correspondingly outputting a level signal. The controller electrically connected to the container and the pressure-leveling sensor is used for outputting a discharge signal to have the container discharge the processing solution after a predetermined amount of wafers has been etched by the processing solution, and controlling a charge valve to charge the container with the processing solution in response to the level signal. The cleaning-solution pipe connected to the gas-supplying pipe is used for providing a cleaning solution to the gas-supplying pipe to clean particles remained on an inner surface of the gas-supplying pipe when the processing solution is discharged from the container. The cup-shaped joint is used for jointing the cleaning-solution pipe with the gas-supplying pipe so as to increase a contact surface area between the gas and the cleaning solution remained in the cup-shaped joint when the gas passes through the gas-supplying pipe.

According to the present invention, the container includes a discharge valve for discharging the processing solution therefrom in response to the discharge signal.

The auto-cleaning device of the present invention for cleaning a gas-supplying pipe includes a timing controller, a triple valve, a cleaning-solution pipe, a clean valve, and a control switch. The timing controller electrically connected to a controller is used for starting to measure a predetermined time when a discharge signal outputted from the controller is received, and outputting a clean-stop signal after the predetermined time. The triple valve is electrically connected to the controller and the timing controller and having a first end connected to a pressure-leveling sensor, a second end connected to the gas-supplying pipe, and a third end connected to the atmosphere, conducting the first end with the third end in response to the discharge signal and conducting the first end with the second end in response to the clean-stop signal. The cleaning-solution pipe connected between the second end of the triple valve and the gas-supplying pipe is used for providing a cleaning solution to the gas-supplying pipe to clean particles remained on an inner surface of the gas-supplying pipe. The clean valve set on the cleaning-solution pipe is used for opening the cleaning-solution pipe in response to the discharge signal, and closing the cleaning-solution pipe in response to the clean-stop signal. The control switch electrically connected to the controller, the timing controller and the pressure-leveling sensor is used for switching off the pressure-leveling sensor in response to the discharge signal, and switching on the pressure-leveling sensor in response to the clean-stop signal.

The present invention may best be understood through the following description with reference to the accompanying drawings, in which:

DETAILED DESCRIPTION OF THE PREFERRED EMBODIMENTS

Figure 1:
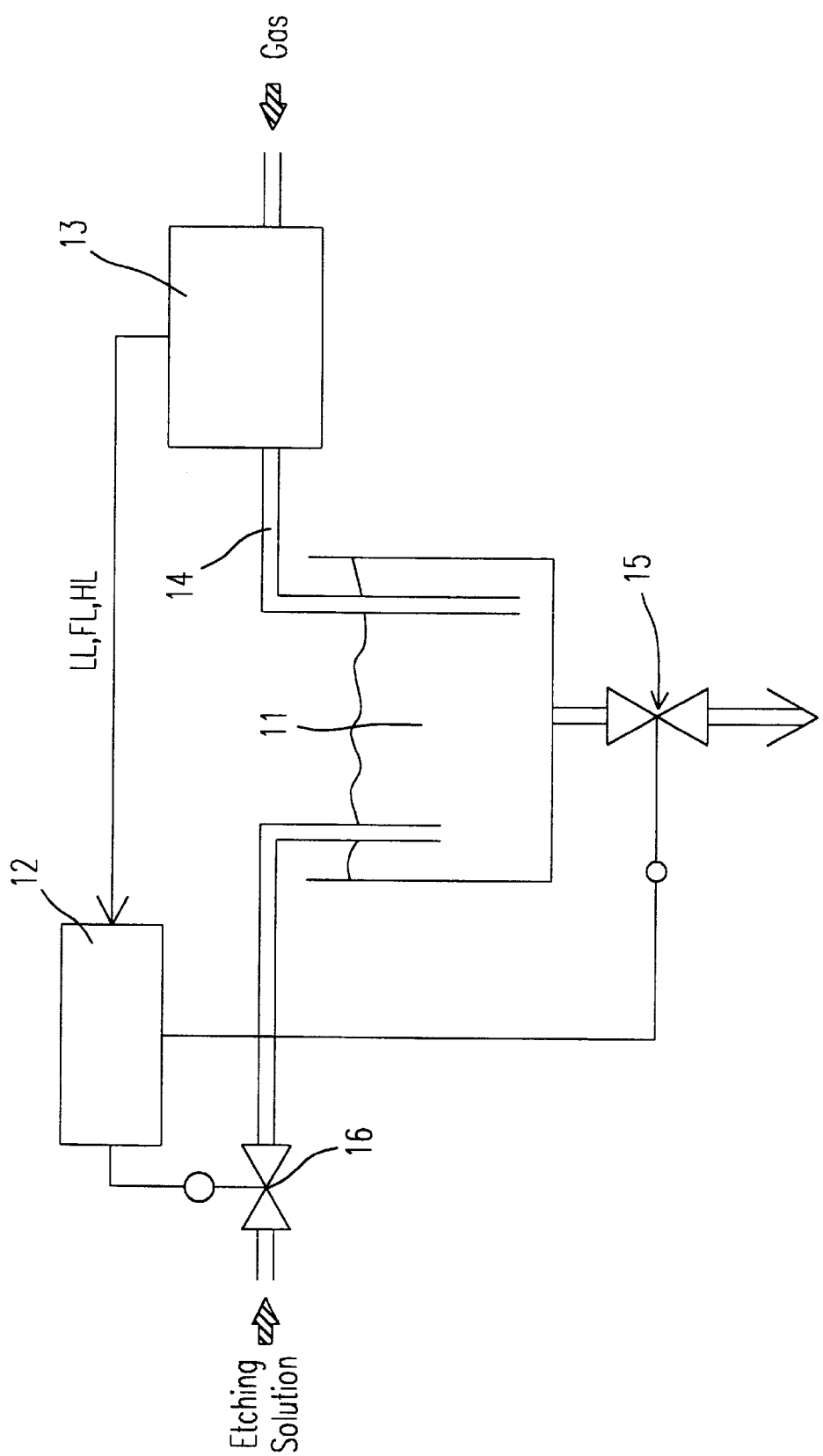
FIG. 1 schematically shows a conventional wafer-processing apparatus.
Figure 2:
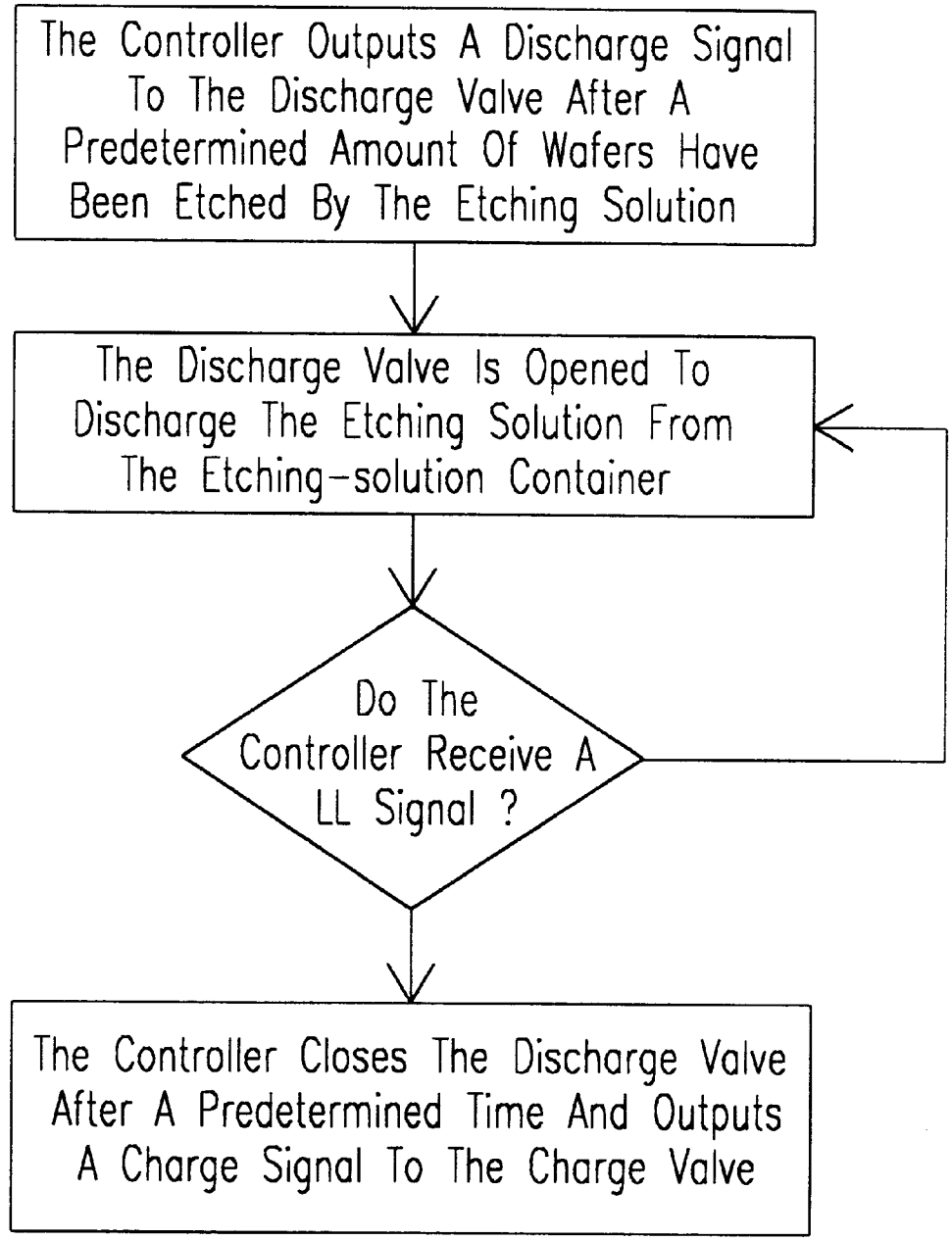
FIG. 2 is a flowchart showing the etching-solution-renewing process of the conventional wafer-processing apparatus.
Figure 3:
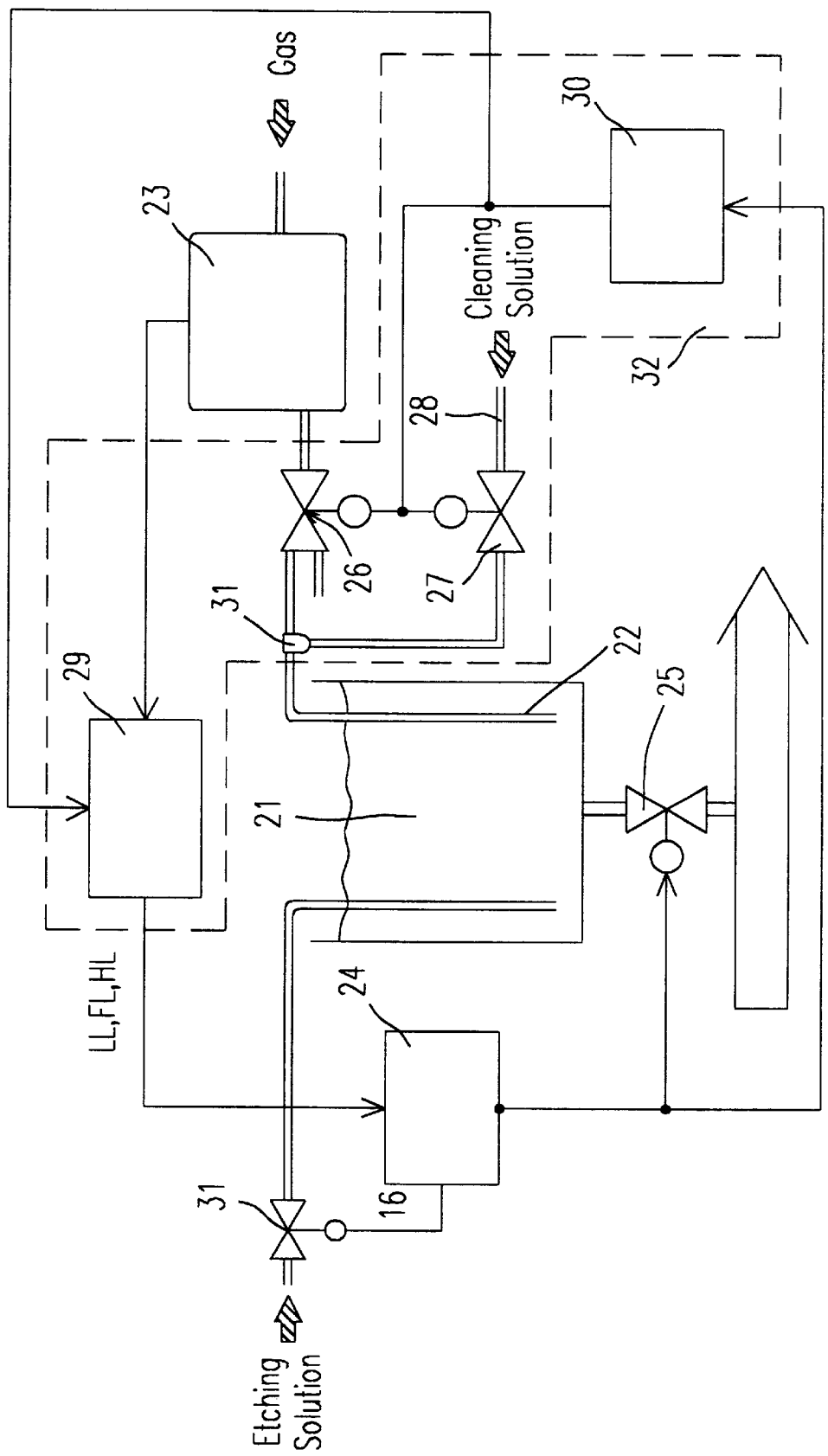
FIG. 3 schematically shows the wafer-processing apparatus of the present invention.

FIG. 3 schematically shows the wafer-processing apparatus of the present invention. The wafer-processing apparatus of the present invention includes a container 21, a controller 24, a discharge valve 25, a charge valve 31, a gas-supplying pipe 22, and a pressure-leveling sensor 23. The container 21 is used for containing a processing solution, preferably an etching solution, such as the buffer hydrofluoric acid solution (BHF) and buffer oxide etcher (BOE). The gas-supplying pipe 22 is used for supplying a gas into the etching solution container 21. The gas is preferably an inert gas, such as argon gas (Ar), or nitrogen gas ($N_2$). Because the pressure of the gas contained in the gas-supplying pipe 22 is relative to the level of the etching solution, the level change of the etching solution can be controlled by detecting the pressure change of the gas. The pressure-leveling sensor 23 is used for detecting the pressure change of gas contained in the gas-supplying pipe 22 and correspondingly outputting a level signal to a controller 24. There are three kinds of level signals. A FIX level (FL) signal represents that the level of the etching solution is at a suitable level, a LOW level (LL) signal represents that the level of the etching solution is lower than the suitable level, and a HIGH level (HL) signal represents that the level of the etching solution is higher than the suitable level. Therefore, the controller 24 can control the level of the etching solution contained in the container 21 according to the level signal. In addition, the controller 24 outputs a discharge signal to the discharge valve 25 to open the discharge valve 25 so as to discharge the etching solution contained in the container after a predetermined amount of wafers has been etched by the etching solution. While the etching solution is discharged, an auto-cleaning device 32 of the wafer-processing apparatus starts to clean the gas-supplying pipe 22 automatically.

Figure 4:
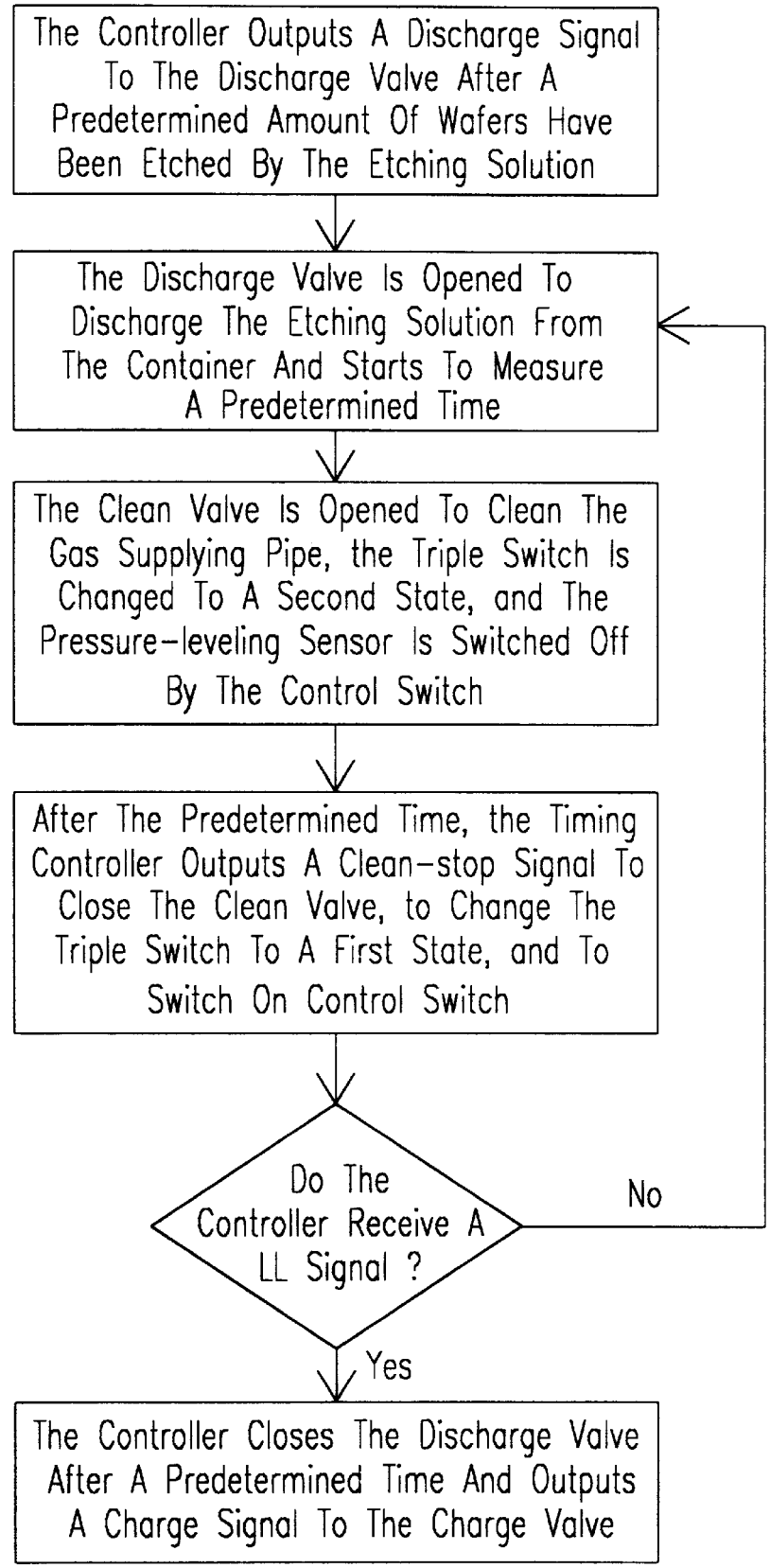
FIG. 4 is a flowchart showing the etching-solution-renewing process of the wafer-processing apparatus according to the present invention.

The auto-cleaning device 32 of the present invention includes a timing controller 30, a triple valve 26, a cleaning-solution pipe 28, a clean valve 27, and a control switch 29. The triple valve 26 has a first end connected to the pressure-leveling sensor 23, a second end connected to the gas-supplying pipe 22, and a third end connected to the atmosphere. The cleaning-solution pipe 28 is jointed with the second end of the triple valve 26. The etching-solution-renewing process of the wafer-processing apparatus according to the present invention is shown in FIG. 4.

When the controller 24 outputs the discharge signal to the discharge valve after a predetermined amount of wafers has been etched by the etching solution, the discharge valve 25 is opened to discharge the etching solution from the container 21. The timing controller 30 also receives the discharge signal, and starts to count a predetermined time (a time for cleaning the gas-supplying pipe 22). Then, the discharge signal is transmitted to the triple valve 26, the clean valve 27 and the control switch 29. Thereafter, the clean valve 27 is opened to supply a cleaning solution from the cleaning-solution pipe 28. The triple valve 26 changes from a first state (the first end is conducted with the second end) to the second state (the first end is conducted with the third end). The pressure-leveling sensor 23 is switched off by the control switch 29.

Because the clean valve 27 is opened, particles remained on the inner surface of the gas-supplying pipe 22 can be cleaned by the cleaning solution. Because the first end is conducted with the third end of the triple valve, the pressure-leveling sensor 23 will not contact any cleaning solution so as to protect the pressure-leveling sensor 23. In addition, because the pressure-level sensor is switched off by the control switch 29, the controller 24 will not receive any wrong level signal so that the misactions can be prevented.

After the predetermined time, the timing controller 30 will output a clean-stop signal to close the clean valve 27, to change the triple valve 26 from the second state (the first end is conducted with the third end) to the first state (the first end is conducted with the second end), and to switch on the control switch 29. At this instant, the gas is again supplied into the container 21 and the pressure-leveling sensor 23 again detects the pressure change of the gas contained in the gas-supplying pipe.

Because the control switch 29 is switched on , the pressure-leveling sensor 23 can output the level signal to the controller 24. Therefore, the controller 24 will receive an LL signal because the level of the etching solution is dropped below the suitable level. When the controller 24 receives the LL signal, the controller 24 outputs a close signal to close the discharge valve 25 after a short time to ensure that the etching solution is discharged completely. Then, the controller 24 outputs a charge signal to the charge valve 31 so as to open the charge valve 16 to charge the etching solution into the container 21. The charge valve 16 will be closed by the controller 24 until an FL signal is outputted from the pressure-leveling sensor 23. Therefore, one cycle of the etching-solution-renewing process is finished.

To achieve a better cleaning efficiency, the joint of the cleaning-solution pipe 28 with the second end of the triple valve 26 and the gas-supplying pipe 22 is preferably a cup-shaped joint 31. Therefore, even when the clean valve 27 is closed, the cup-shaped joint 31 can still contain some cleaning solution. The cup-shaped joint 31 will increase the contact surface area between the gas and the cleaning solution when the gas passes through the gas-supplying pipe. In addition, because some of the cleaning solution will evaporate, the solutes dissolved out from the damp will be reduced.

The cleaning solution is preferably water and the control switch 29 is preferably a relay. Of course, the auto-cleaning device of the present invention can be used in any kind of apparatus that has the problems of pipe choke.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A wafer-processing apparatus comprising:
    a container for containing a processing solution;
    a gas-supplying pipe for supplying a gas into said container, wherein a pressure of said gas contained in said gas-supplying pipe is relative to a level of said processing solution;
    a pressure-leveling sensor connected to said gas-supplying pipe for detecting a pressure change of said gas contained in said gas-supplying pipe and correspondingly outputting a level signal;
    a controller electrically connected to said pressure-leveling sensor for outputting a discharge signal to have said container discharge said processing solution after a predetermined amount of wafers has been processed by said processing solution, and controlling a charge valve to charge said container with said processing solution in response to said level signal; and
    an auto-cleaning device connected to said gas-supplying pipe and said pressure-leveling sensor and electrically connected to said controller, stopping said gas being supplied into said container, stopping said pressure-leveling sensor to output said level signal, and cleaning said gas-supplying pipe with a cleaning solution in response to said discharge signal, and then outputting a clean-stop signal to restart said gas being supplied into said container, to restart said pressure-leveling sensor to output said level signal, and to stop said cleaning of said gas-supplying pipe after a predetermined time.

2. The wafer-processing apparatus according to claim 1 wherein said container comprises a discharge valve for discharging said processing solution therefrom in response to said discharge signal.

3. The wafer-processing apparatus according to claim 2 wherein said auto-cleaning device comprises:
    a timing controller electrically connected to said controller and said pressure-leveling sensor, starting to count said predetermined time when said discharge signal is received, and outputting said clean-stop signal after said predetermined time;

a triple valve electrically connected to said controller and said timing controller and having a first end connected to said pressure-leveling sensor, a second end connected to said gas-supplying pipe, and a third end connected to outside, wherein said first end is conducted with said third end in response to said discharge signal and said first end is conducted with said second end in response to said clean-stop signal;

a cleaning-solution pipe connected between said second end of said triple valve and said gas-supplying pipe for providing said cleaning solution to said gas-supplying pipe to clean particles remained on an inner surface of said gas-supplying pipe;

a clean valve set on said cleaning-solution pipe, opening said cleaning-solution pipe in response to said discharge signal, and closing said cleaning-solution pipe in response to said clean-stop signal; and a control switch electrically connected to said controller, said timing controller and said pressure-leveling sensor, switching off said pressure-leveling sensor in response to said discharge signal, and switching on said pressure-leveling sensor in response to said clean-stop signal.

4. The wafer-processing apparatus according to claim 3 wherein said cleaning-solution pipe comprises a cup-shaped joint for jointing said cleaning-solution pipe with said second end of said triple valve and said gas-supplying pipe so as to increase a contact surface area between said gas and said cleaning solution remained in said cup-shaped joint when said gas pass through said gas-supplying pipe.

5. The wafer-processing apparatus according to claim 3 wherein said control switch is a relay.

6. The wafer-processing apparatus according to claim 1 wherein said processing solution is an etching solution.

7. The wafer-processing apparatus according to claim 6 wherein said etching solution is a buffer oxide etcher (BOE).

8. The wafer-processing apparatus according to claim 6 wherein said etching solution is a buffer hydrofluoric acid (BHF) solution.

9. The wafer-processing apparatus according to claim 1 wherein said cleaning solution is water.

10. The wafer-processing apparatus according to claim 9 wherein said inert gas is argon gas (Ar).

11. The wafer-processing apparatus according to claim 1 wherein said gas is an inert gas.

12. The wafer-processing apparatus according to claim 1 wherein said gas is nitrogen gas ($N_2$).

13. The wafer-processing apparatus according to claim 1 wherein said gas has been dried in advance.

14. A wafer-processing apparatus comprising:

a container for containing ah processing solution;

a gas-supplying pipe for supplying a gas into said container, wherein a pressure of said gas contained in said gas-supplying pipe is relative to a level of said processing solution;

a pressure-leveling sensor connected to said gas-supplying pipe for detecting a pressure change of said gas contained in said gas-supplying pipe and correspondingly outputting a level signal;

a controller electrically connected to said container and said pressure-leveling sensor for outputting a discharge signal to have said container discharge said processing solution after a predetermined amount of wafers has been etched by said processing solution, and controlling a charge valve to charge said container with said processing solution in response to said level signal;

a cleaning-solution pipe connected to said gas-supplying pipe for providing a cleaning solution to said gas-supplying pipe to clean particles remained on an inner surface of said gas-supplying pipe when said processing solution is discharged from said container; and a cup-shaped joint for jointing said cleaning-solution pipe with said gas-supplying pipe so as to increase a contact surface area between said gas and said cleaning solution remained in said cup-shaped joint when said gas passes through said gas-supplying pipe.

15. The wafer-processing apparatus according to claim 14 wherein said container comprises a discharge valve for discharging said processing solution therefrom in response to said discharge signal.

16. The wafer-processing apparatus according to claim 15, further comprising:

a timing controller electrically connected to said controller and said pressure-leveling sensor, starting to count a predetermined time when receiving said discharge signal, and outputting a clean-stop signal after said predetermined time;

a triple valve electrically connected to said controller and said timing controller and having a first end connected to said pressure-leveling sensor, a second end connected to said gas-supplying pipe, and a third end connected to outside, wherein said first end is conducted with said third end in response to said discharge signal and said first end is conducted with said second end in response to said clean-stop signal;

a clean valve set on said cleaning-solution pipe, opening said cleaning-solution pipe in response to said discharge signal, and closing said cleaning-solution pipe in response to said clean-stop signal; and a control switch electrically connected between said controller, said timing controller and said pressure-leveling sensor, switching off said pressure-leveling sensor in response to said discharge signal, and switching on said pressure-leveling sensor in response to said clean-stop signal.

17. The wafer-processing apparatus according to claim 16 wherein said control switch is a relay.

18. The wafer-processing apparatus according to claim 14 wherein said processing solution is an etching solution.

19. The wafer-processing apparatus according to claim 18 wherein said etching solution is a buffer oxide etcher (BOE).

20. The wafer-processing apparatus according to claim 18 wherein said cleaning solution is water.

21. The wafer-processing apparatus according to claim 14 wherein said gas is an inert gas.

22. An auto-cleaning device for cleaning a gas-supplying pipe, controlled by a controller, comprising:

a timing controller electrically connected to said controller, starting to measure a predetermined time when a discharge signal outputted from said controller is received, and outputting a clean-stop signal after said predetermined time;

a triple valve electrically connected to said controller and said timing controller and having a first end connected to a pressure-leveling sensor, a second end connected to said gas-supplying pipe, and a third end connected to the atmosphere, conducting said first end with said third end in response to said discharge signal and conducting said first end with said second end in response to said clean-stop signal;

a cleaning-solution pipe connected between said second end of said triple valve and said gas-supplying pipe for providing a cleaning solution to said gas-supplying pipe to clean particles remained on an inner surface of said gas-supplying pipe;

a clean valve set on said cleaning-solution pipe, opening said cleaning-solution pipe in response to said discharge signal, and closing said cleaning-solution pipe in response to said clean-stop signal; and a control switch electrically connected to said controller, said timing controller and said pressure-leveling sensor, switching off said pressure-leveling sensor in response to said discharge signal, and switching on said pressure-leveling sensor in response to said clean-stop signal.

* * * * *